United States Patent [19]

Cook et al.

[11] Patent Number: 4,498,953

[45] Date of Patent: Feb. 12, 1985

[54] ETCHING TECHNIQUES

[75] Inventors: Joel M. Cook, Union Township, Hunterdon County; Vincent M. Donnelly, Berkeley Heights; Daniel L. Flamm, Chatham Township, Morris County; Dale E. Ibbotson, Westfield; John A. Mucha, Madison, all of N.J.

[73] Assignee: AT&T Bell Laboratories, Murray Hill, N.J.

[21] Appl. No.: 517,754

[22] Filed: Jul. 27, 1983

[51] Int. Cl.$^3$ .................... B44C 1/22; C03C 15/00; C03C 25/06; C23F 1/02
[52] U.S. Cl. .................... 156/646; 156/655; 156/656; 156/657; 156/659.1; 156/662; 156/664; 252/79.1
[58] Field of Search ............ 156/643, 646, 654–659.1, 156/662, 664, 628; 252/79.1, 79.3; 204/192 E

[56] References Cited

U.S. PATENT DOCUMENTS 3,669,774 6/1972 Dismukes ........................ 156/646
4,314,875 2/1982 Flamm ........................ 252/79.1 X

FOREIGN PATENT DOCUMENTS 1180187 2/1970 United Kingdom .

Primary Examiner—William A. Powell
Attorney, Agent, or Firm—Bruce S. Schneider

[57] ABSTRACT

A highly selective—greater than 100 to 1—etch for silicon, tantalum, tantalum silicide and tantalum nitride is achieved by using polyatomic halogen fluorides. The selectivity is achievable without employing plasmas or wet etching.

22 Claims, No Drawings

ETCHING TECHNIQUES

BACKGROUND OF THE INVENTION

1. Field of the Invention

This invention relates to device processing and, in particular, to semiconductor processing.

2. Art Background

The selective etching of materials in processes such as semiconductor device processing is often required. For example, it is desirable in certain situations, such as in the production of appropriately configured gate oxides, to remove a region of silicon essentially without causing significant damage to an underlying or adjacent region of a silicon oxide, e.g., silicon dioxide. Processes such as plasma etching and reactive ion etching are often utilized to accomplish these results. In these techniques a gas is typically introduced in proximity to the body to be etched and a plasma is established in the gaseous medium producing molecular fragments, atoms, and ions. The resulting energetic entities produced by the plasma are directed towards the substrate and through various mechanisms remove the impacted material. By a particular choice of processing conditions and gases the rate of removal of a given material is, to an extent, controlled relative to the removal rate of other materials.

While in many situations etching involving energetic entities is advantageously employed, it is not without associated difficulties. The energetic particles produced in the plasma often affect even materials which are not etched at a substantial rate by, for example, inducing pitting or by unacceptably modifying surface electronic states. Pitting and electronic state modification for many device applications are not desirable since they often lead to defective device structures and thus device failure. Additionally, the use of a plasma also often leads to the deposition of contaminating materials onto the substrate surface. These contaminating materials, such as compounds produced from the plasma gas, and/or non-volatile metals from the reaction vessel, e.g., aluminum, either degrade device properties or hinder subsequent processing procedures.

Wet etching, i.e., use of a liquid based chemical that rapidly reacts with the material to be etched as compared to its rate of reaction with underlying or masked adjacent materials, is an alternative to plasma etching. Again, although wet chemical etching is advantageously employed in many procedures, it too is not without difficulties. For example, wet chemical etching leads to difficulties in handling and disposal of the associated chemicals. Additionally, if the temperature and concentration of the reagents are not carefully maintained, inconsistent results are obtained. Inconsistent results also arise from the wet etchant failing to reach micron features due to surface tension effects.

Although in many circumstances etching techniques, e.g., plasma etching and wet chemical etching, exhibit a degree of selectivity between the material being etched and adjoining material, this level of selectivity is generally not particularly high. For typical etching systems, selectivity, i.e., the rate of etching of the desired region relative to underlying or unmasked adjacent regions of different compositions, is not greater than 20 to 1. However, there are many applications, for example, the selective removal of silicon filaments from extremely thin silicon dioxide gates in high-speed field effect transistors, that require selectivity which is greater than 100 to 1.

Xenon difluoride in the absence of a plasma has been shown to produce selective etching between silicon dioxide and silicon. (See H. F. Winters et al, *Applied Physics Letters*, 34, 70 (1979).) However, rare gas halides are generally unstable and relatively costly. As a result, the use of rare gas halides is not a particularly satisfactory solution to the problems associated with other procedures. Therefore, common etching procedures have shortcomings and are not sufficiently selective for some important applications.

SUMMARY OF THE INVENTION

High selectivity, i.e., selectivity greater than 40 to 1, indeed greater than 100 to 1, is achieved in the etching of a variety materials as compared to underlying or unmasked adjacent regions of a second material by the use of polyatomic halogen fluorides either alone, as mixtures, or combined with inert gases, e.g., argon. For example, materials such as silicon, non-oxidic molybdenum compositions, non-oxidic tantalum compositions, e.g., tantalum, tantalum nitride, (materials represented by the formula $Ta_xN_y$ where $x>0$ and $y \geqq 0$) and tantalum silicide, are readily etched as compared to a tantalum oxide, a silicon oxide, or a silicon nitride. The excellent selectivity of the invention is achieved in the absence of a plasma and without liquid etchants. In particular, materials such as $BrF_5$, $BrF_3$, $ClF_3$, and $IF_5$, have been found to produce this result. In contrast, diatomic halogen fluorides such as $F_2$, $ClF$, and $Cl_2$ either (1) do not etch materials such as silicon or tantalum compositions, e.g., the silicide, nitride or elemental metal at all or (2) demonstrate extremely low etch rates. The selective etching achieved is quite useful in many device applications such as for the processing of gate oxides in field effect transistors, or for the production of tantalum nitride thin film resistors in conjunction with tantalum oxide thin film capacitors in hybrid, film integrated circuits. Additionally, the selectivity in the case of silicon is particularly advantageous for cleaning silicon deposits from the walls of chemical vapor deposition reactors.

DETAILED DESCRIPTION

Selective etching is accomplished by simply subjecting the body to be etched to a composition including a polyatomic halogen fluoride in gaseous form. (In this context, a polyatomic molecule is considered one with three or more atoms.) In general, non-oxidic compositions such as silicon, tantalum compositions, e.g., tantalum, tantalum nitrides, tantalum silicides, molybdenum, molybdenum compositions, e.g., molybdenum silicide, tungsten, and tungsten compositions such as tungsten silicide, are typically selectively etched by polyatomic halogen fluorides as compared to a second material if these compositions have a reaction rate of at least $1 \times 10^{14}$ molecules per $cm^2$ per sec as compared to a rate of at least 40 times smaller for that of the second material and provided that only volatile fluoride products, i.e., fluorides with vapor pressures at 26 degrees C. that are greater than 0.001 Torr, are formed. In contrast silicon nitride, the oxides of silicon, the oxides of tantalum, and the oxides of molybdenum and their mixtures that do not have these properties are essentially unetched. The number of fluorine atoms in the polyatomic halogen fluoride is not significant, provided they are present in conjunction with a non-fluorine, halogen atom. For example, polyatomic halogen fluorides such as $BrF_5$, $BrF_3$, $ClF_3$, and $IF_5$ produce the desired degree of selectivity. (Although these compositions are commercially available, the source of these compounds is not critical and it is possible to generate them even in situ through reactions such as fluorination of bromine gas before etching. See N. V. Sidgwick, *The Chemical Elements and Their Compounds*, (London: Oxford University Press, 1952).)

The material to be etched is contacted with the appropriate gas simply by, in one embodiment, introducing this gas into a vessel containing the material. For example, it is possible to evacuate the chamber and then backfill it with any of the polyatomic halogen fluorides. (The use of the term polyatomic halogen fluoride includes not only polyatomic halogen fluoride gases but mixtures of polyatomic halogen fluoride gases.) Alternatively, it is possible to mix the polyatomic halogen fluoride with another gas, e.g., an inert gas, and introduce this mixture into the vessel. (An inert material is one which does not substantially react with the polyatomic halogen fluoride and which also does not react with the substrate in a way which retards the selectivity of the halogen fluoride.) Typically, with or without an inert gas, partial pressures of polyatomic halogen fluorides in the range 1 mTorr to 1 atm are employed. Generally, polyatomic halogen fluoride partial pressures less than 1 mTorr yield extremely low etch rates while partial pressures significantly higher than 1 atm lead to undesirably fast etch rates with the related difficulties in processing control, and thus are not preferred. High partial pressures also have a tendency to lead to the codensation of the product fluorides from the etching process.

Etching is continued until the desired thickness of material is removed. Typical etch rates of materials such as silicon and tantalum compositions for polyatomic halogen fluoride partial pressures in the range 0.1 to 10 Torr are respectively 50 to 5000 Å/min and 200 to 3000 Å/min. Therefore, quite nominal etching times are required for material thicknesses less than 100 $\mu$m. For most applications etching is limited to only a portion of a substrate through conventional lithography such as the use of patterned organic resists. However, as discussed, if, for example, a silicon region is to be etched, exposed regions of a silicon oxide need not be masked. After the etching is performed, the device is completed by conventional techniques such as described by S. Sze, *VLSI Technology*, (McGraw Hill, 1983) in the case of integrated circuits and by R. W. Berry et al, *Thin Film Technology*, (New York: R. E. Krieger Publishing Company, 1979) in the case of hybrid, film integrated circuits.

The cleaning of deposition equipment, e.g., CVD reactors is similarly performed by introducing the previously discussed concentrations of polyatomic halogen fluorides into the reactor. Etching is continued until the contamination, e.g., silicon, which is formed on the reactive walls—typically quartz or glass walls—is removed. Again for silicon deposits having thicknesses in the range 5 Å to 100 $\mu$m, nominal etching times are required.

The following examples are illustrative of the invention.

EXAMPLE 1

A hybrid, film integrated circuit on an alumina substrate was etched utilizing a polyatomic halogen fluoride. This circuit contained both thin film capacitors and resistors. The former were fabricated with anodically grown $Ta_2O_5$ as the dielectric, a Ta composition containing 13 to 16 atomic percent nitrogen as the bottom electrode and Au as the counterelectrode. The resistors were defined by a photoresist pattern generated on a thin $Ta_2N$ film deposited after the capacitor anodization step.

The hybrid, film integrated circuit structure was placed on the sample holder of an aluminum chamber. The chamber was evacuated utilizing a mechanical roughing pump and booster stage to a pressure of approximately 5 mTorr. A flow of $ClF_3$ was then introduced into the chamber while vacuum pumping of the chamber was continued. The $ClF_3$ flow was adjusted to produce a pressure in the chamber of approximately 5 Torr. The $ClF_3$ flow was maintained for approximately 3 minutes and then terminated. Inspection of the hybrid, film integrated circuit with an optical microscope indicated that the tantalum nitride was completely removed in regions where it had been contacted by the gas while exposed regions of gold or tantalum oxide were essentially untouched. The regions of tantalum nitride underlying the photoresist were not affected by the $ClF_3$ nor was the photoresist significantly removed.

EXAMPLE 2

The procedure of Example 1 was followed except that $BrF_3$ was utilized as the etchant gas. The results were the same as those of Example 1.

EXAMPLE 3

The procedure of Example 1 was followed except the etching was done at a total pressure of 1 atm. This pressure was established by preparing a mixture of $ClF_3$ diluted to 5 percent in helium. The chamber was purged with a flow of argon and a sufficient flow of the helium/chlorine trifluoride mixture was introduced into the chamber and continued so that the measured pressure in the chamber remained at approximately 1 atm. Additionally, the sample was heated to a temperature of 86 degrees C. utilizing a resistively heated substrate holder. This heating was utilized to ensure that any products produced from the etching procedure were not deposited onto the hybrid, film integrated circuit.

EXAMPLE 4

An n-type silicon wafer measuring 3 inches in diameter and having its major surface in the (100) crystallographic plane was masked with a 1 $\mu$m thick pattern of silicon dioxide. This pattern was formed from squares of silicon dioxide 5 mm on a side covering the entire water surface and separated from each adjoining square by a 285 micron wide region of the silicon substrate. Samples typically measuring 3 mm on a side were cleaved from the masked wafer. The samples were cleaned by sequential rinses in methylene chloride, acetone, and methanol and then dipped in a 50 percent HF aqueous solution to remove any native oxide. Before use, the sample was rinsed in deionized water and blown dry in clean nitrogen.

The sample was placed on the sample holder of an aluminum chamber. The apparatus was evacuated to a pressure of approximately 5 mTorr and the sample was maintained at a temperature of approximately 23 degrees C. utilizing the resistively heated sample holder. A flow of $BrF_3$ was introduced into the chamber and was regulated to produce a pressure in the chamber of approximately 1 Torr. After approximately 5 minutes, the BrF$_3$ flow was terminated, the reactor was again evacuated, and the apparatus was then backfilled with 1 atm of helium.

The sample was removed from the etching apparatus and was immersed in a 50 percent aqueous HF solution for sufficient time to remove the silicon oxide masked material. The samples were then inspected utilizing an optical microscope. This inspection indicated that etch depths of approximately 25 microns were observed in exposed regions of the silicon wafer. This corresponded to an etch rate of approximately 5 microns per minute.

EXAMPLE 5

To measure the etch rate of silicon dioxide in BrF$_3$, the same experiment as in Example 4 was performed except the treatment time was extended to 30 minutes. The thickness of the silicon oxide mask was measured before and after gas exposure utilizing a Nanospec optical thickness monitor. There was no detectable change in thickness of the oxide mask. (The smallest detectable thickness change for the measuring equipment was approximately 2 Å per minute per Torr.)

EXAMPLE 6

An n-type silicon wafer measuring 4 inches in diameter and having its major surface in the (100) crystallographic plane was entirely masked with a 1 μm thick layer of silicon dioxide. A 1 μm thick layer of TaSi$_2$ was then deposited over the silicon dioxide. Samples measuring 1 cm on a side were cleaved from the wafer. The samples were cleaned in sequential rinses in methylene chloride, acetone and methanol and blown dry with clean nitrogen. The samples were placed on the sample holder of an aluminum chamber. The apparatus was evacuated to a pressure of 5 mTorr and the samples were maintained at a temperature of approximately 80 degrees C. A flow of BrF$_3$ was established and regulated to produce a pressure of 5 Torr of BrF$_3$ in the chamber. After approximately 2 minutes, the BrF$_3$ flow was terminated, the reactor was again evacuated, and the apparatus was then backfilled with 1 atm of helium. All TaSi$_2$ was totally removed from the entire surface of the silicon dioxide layer.

EXAMPLE 7

The procedure of Example 6 was followed except Ta was deposited on the 1 μm thick silicon dioxide. The Ta layer was subjected to ClF$_3$ at a pressure of 1 Torr for a period of 2 minutes while maintaining the sample at 70 degrees C. This film was totally removed from the entire surface of the silicon dioxide layer.

What is claimed is:

1. A process for manufacturing a device comprising the steps of (1) subjecting a substrate to an etchant to produce selective etching of a first region of said substrate relative to a second region and (2) completing said device characterized in that said etchant comprises a polyatomic halogen fluoride and said first region comprises a non-oxide tantalum composition wherein said substrate is subjected to said polyatomic halogen fluoride in the substantial absence of a plasma.

2. The process of claim 1 wherein said polyatomic halogen fluoride is chosen from the group consisting of BrF$_5$, BrF$_3$, ClF$_3$, and IF$_5$.

3. The process of claim 1 wherein said device comprises a hybrid, film integrated circuit.

4. The process of claim 1 wherein said tantalum composition comprises a member chosen from the group consisting of tantalum, tantalum nitride, and tantalum silicide.

5. The process of claim 1 wherein said second region comprises a tantalum oxide.

6. The process of claim 1 wherein said first region comprises a member chosen from the group consisting of silicon, molybdenum silicide, molybdenum, tungsten, and tungsten silicide.

7. The process of claim 1 wherein said device is a semiconductor device.

8. A process for treating a body comprising a first region and a second region, said process comprising the step of subjecting said body to an etchant to etch said first region, characterized in that said etchant comprises a polyatomic halogen fluoride wherein said substrate is subjected to said polyatomic halogen fluoride in the substantial absence of a plasma and wherein a substantial fraction of the thickness of said first region is removed.

9. The process of claim 8 wherein said polyatomic halogen fluoride is chosen from the group consisting of BrF$_5$, BrF$_3$, ClF$_3$, and IF$_5$.

10. The process of claim 8 wherein said first region comprises a silicon oxide and said second region comprises silicon.

11. The process of claim 8 wherein said body comprises a contaminated deposition apparatus where said first region is said contamination.

12. A process for manufacturing a device comprising the steps of (1) subjecting a substrate to an etchant to produce selective etching of a first region of said substrate relative to a second region and (2) completing said device characterized in that said etchant comprises a polyatomic halogen fluoride wherein said substrate is subjected to said polyatomic halogen fluoride in the substantial absence of a plasma, and wherein a substantial fraction of the thickness of said first region is removed.

13. The process of claim 12 wherein said polyatomic halogen fluoride is chosen from the group consisting of BrF$_5$, BrF$_3$, ClF$_3$, and IF$_5$.

14. The process of claim 12 wherein said device is a semiconductor device.

15. The process of claim 12 wherein said device comprises a hybrid, film integrated circuit.

16. The process of claim 12 wherein said first region comprises a non-oxide tantalum composition.

17. The process of claim 16 wherein said tantalum composition comprises a member chosen from the group consisting of tantalum, tantalum nitride, and tantalum silicide.

18. The process of claim 12 wherein said second region comprises a tantalum oxide.

19. The process of claim 12 wherein said first region comprises a member chosen from the group consisting of silicon, molybdenum silicide, molybdenum, tungsten, and tungsten silicide.

20. The process of claim 12 wherein said second region comprises a member chosen from the group consisting of a silicon oxide and a silicon nitride.

21. A process for manufacturing a device comprising the steps of (1) subjecting a substrate to an etchant to produce selective etching of a first region of said substrate relative to a second region and (2) completing said device characterized in that said etchant comprises a polyatomic halogen fluoride wherein said substrate is subjected to said polyatomic halogen fluoride in the substantial absence of a plasma and wherein said first region comprises a member chosen from the group consisting of silicon, molybdenum silicide, molybdenum, tungsten, and tungsten silicide.

22. The process of claim 21 wherein said second region comprises a member chosen from the group consisting of a silicon oxide and a silicon nitride.

* * * * *